(12) United States Patent
Manepalli et al.

(10) Patent No.: US 7,033,911 B2
(45) Date of Patent: Apr. 25, 2006

(54) ADHESIVE OF FOLDED PACKAGE

(75) Inventors: Rahul N. Manepalli, Phoenix, AZ (US); Karen Y. Paghasian, Makati (PH); Shinobu Kourakata, Tsukuba (JP); Ruel D R Aranda, Dasmarinas (PH)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/815,540

(22) Filed: Mar. 31, 2004

(65) Prior Publication Data

US 2005/0224993 A1 Oct. 13, 2005

(51) Int. Cl.
*H01L 21/30* (2006.01)
*H01L 21/46* (2006.01)

(52) U.S. Cl. .................. 438/455; 438/645

(58) Field of Classification Search .......... 438/455, 438/626, 631, 644, 645
See application file for complete search history.

(56) References Cited

U.S. PATENT DOCUMENTS

| 6,869,825 | B1 * | 3/2005 | Chiu | 438/106 |
| 6,879,047 | B1 * | 4/2005 | Heo | 257/777 |
| 2004/0124527 | A1 * | 7/2004 | Chiu | 257/723 |

* cited by examiner

*Primary Examiner*—Phuc T. Dang
(74) *Attorney, Agent, or Firm*—Schwegman, Lundberg, Woessner & Kluth, P.A.

(57) ABSTRACT

A package includes a flexible substrate with a first region and a second region, an encapsulated die supported by the first region, and a conformable fold adhesive introduced between the encapsulated die and the flexible substrate. The second region of the flexible substrate is folded over the surface of the encapsulated die.

17 Claims, 4 Drawing Sheets

ADHESIVE OF FOLDED PACKAGE

BACKGROUND

For semiconducting devices, increase in speed, in functionality and thus performance, is often associated with increased size for the semiconducting device packages. However, it is desirable to reduce the overall height of the package, to allow for greater integration and flexibility.

DETAILED DESCRIPTION

Figure 1:
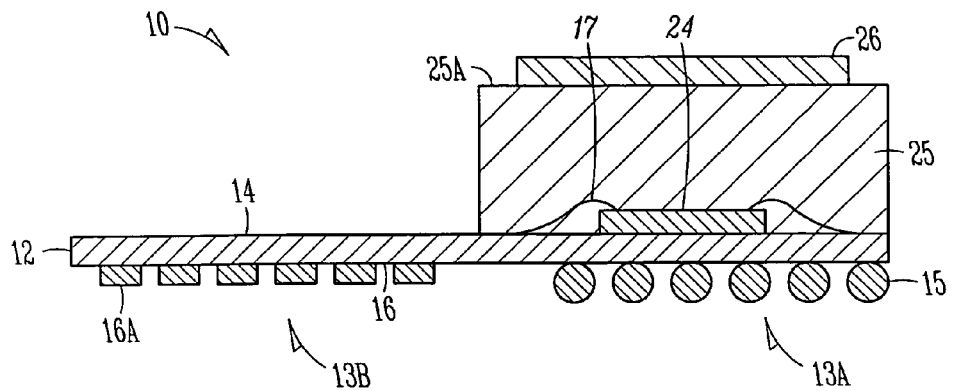
FIG. 1 is a side view illustrating one embodiment of a package prior to folding.

In the following detailed description reference is made to the accompanying drawings. In the drawings, like numerals describe substantially similar components throughout the several views. Other embodiments may be utilized, and structural, logical, and electrical changes may be made.

FIG. 1 illustrates one embodiment of a package 10. The package 10 includes a flexible substrate 12 with a first region 13A, a second region (or flap) 13B, a front side 14, and a back side 16. The package 10 includes wire bonds 17 that electrically couple a die 24 with the substrate 12. The substrate 12 supports the die 24 on the front side 14 at the first region 13A. A die encapsulant 25 encapsulates the die 24 and the wire bonds 17. In one embodiment, not shown, the die 24 is supported by a die attach layer on the substrate.

The package 10 also includes solder balls 15 formed on the back side 16 at the first region 13A. The solder balls 15 in a ball grid array are mounted to form an electrical-mechanical connection between die 24 and other electrical devices. At the back side 16 of the substrate 12 at the second region 13B are land pads 16A or bond pads at which various memory devices (such as top package 40 in FIG. 3) can be attached, as described in more detail below.

The thickness of flexible substrate 12 is typically about 0.1 mm. In one embodiment, the flexible substrate 12 is a polyimide tape based material. Conductive paths for electrical communication are formed in flexible substrate 12. In one embodiment, the flexible substrate has conductive traces, such as copper wires, along the length of one or both surfaces/sides of the substrate 12 for electrical connections. In one embodiment, the electrical traces wrap around the edges of the substrate or electrically connect through the substrate. A number of materials may be used for the flexible substrate 12 and the conductive paths therein. The choice of materials will depend on the relevant circuit design considerations and the costs that are associated with fabricating the package 10 (among other factors).

The die encapsulant 25 typically has a thickness in a range from about 0.2 mm to about 0.5 mm. The die encapsulant is epoxy or some other suitable material, in this embodiment. A number of materials may be used for the die encapsulant. The choice of materials will depend on the relevant circuit design considerations and the costs that are associated with fabricating the semiconducting package.

In this embodiment, the package 10 includes a fold adhesive 26 that is manually or automatically dispensed over a surface 25A of the die encapsulant 25. In one embodiment, a predetermined amount of adhesive 26 is dispensed. In this embodiment, the adhesive 26 is compliant and able to deform under stress, as discussed in more detail below.

In other embodiments, other fabrication processes such as lead bonding, bump bonding, and die stacking are typically performed on die 24 prior to die encapsulation. It should be noted that packages may include any number of units of die and die encapsulant, and they can be formed on the front side 14 or back side 16 of the flexible substrate 12 at the first region 13A or at the second region 13B.

Figure 2:
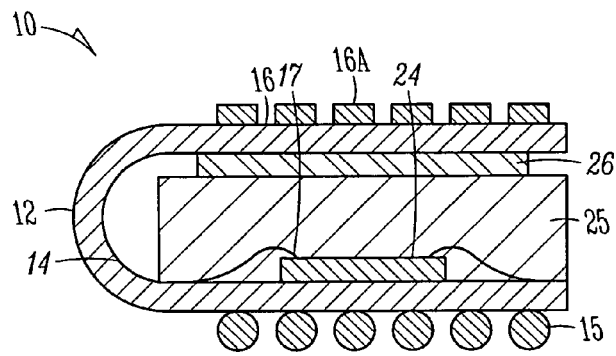
FIG. 2 is a side view illustrating one embodiment of the package of FIG. 1 after folding.

As shown in FIG. 2, the packaging process includes folding the flexible substrate 12 over the die encapsulant 25 such that the land pads 16A are on top of the package 10. The second region 13B of the front side 14 of the flexible substrate contacts the fold adhesive 26, as does the surface 25A of the die encapsulant 25. The fold adhesive 26 is then cured to hold the folded package 10 together. In one embodiment, curing the fold adhesive includes a partial cure of the fold adhesive using a temperature and/or pressure cure process, and then a substantially full cure using a temperature batch cure process, as described in more detail below.

In a first embodiment, the fold adhesive is a conformable fold adhesive. In this embodiment, the conformable folding adhesive is able to conform to a warped surface to form a substantially flat surface. In one embodiment, the conformable fold adhesive has a volumetric cure shrinkage of less than about 0.8%. In an additional embodiment, the conformable fold adhesive has a Young's modulus of less than about 600 MPa at about room temperature. In yet another additional embodiment, the conformable fold adhesive has an elongation at break greater than about 100% at about room temperature. In one embodiment, the fold adhesive has a low Young's modulus and a high elongation prior to break. The conformable fold adhesive, in one embodiment, has one of these characteristics, but may have two or more of the various characteristics. In one embodiment, the fold adhesive is a film. In another embodiment, the fold adhesive 26 is a paste.

In one embodiment, the fold adhesive 26 is dispensed directly onto the surface 25A of the die encapsulant 25. In an additional embodiment, the fold adhesive 26 is dispensed directly onto the front side 14 at the second region 13B of the substrate 12, and then the substrate 12 is folded over where the adhesive 26 aligns with the die encapsulant 25.

In one embodiment, the fold adhesive is made of at least one of silicone, a silicone based polymer, a silicone modified epoxy, and a polyimide-siloxane based system. In one embodiment, the fold adhesive is made of at least one of vinyl terminated silane, hydrogen terminated silane, platinum catalyst, fumed silica and other filler particles. In one embodiment, the fold adhesive is made of at least one of polyimide siloxane, aliphatic epoxy, phenol hardener, and imidazole catalyst. In one embodiment, the fold adhesive is made of at least one of an epoxy, an amine end capped silicone, phosphine catalyst, and a silica filler. The following tables list examples of percentage by weight for each component in embodiments of a fold adhesive.

EXAMPLE 1

| Component | Weight % |
| --- | --- |
| Vinyl terminated silane | 50–80 |
| Hydrogen terminated silane | 10–30 |
| Platinum catalyst | Less than 1 |
| Fumed silica | 5–10 |

EXAMPLE 2

| Component | Weight % |
| --- | --- |
| Polyimide siloxane | 60–90 |
| Aliphatic epoxy | 5–10 |
| Phenol hardener | 5–10 |
| Imidazole catalyst | Less than 1 |

EXAMPLE 3

| Component | Weight % |
| --- | --- |
| Epoxy | 40–80 |
| Amine end capped silicones | 20–40 |
| Phosphine catalyst | Less than 1 |
| Silica filler | 10–40 |

Figure 3:
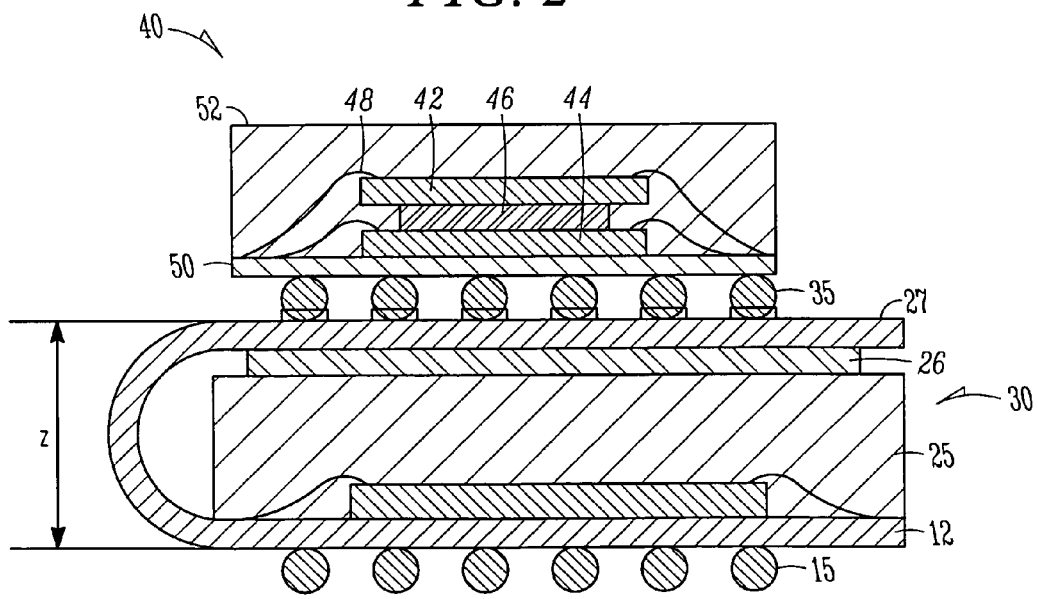
FIG. 3 is a side view illustrating one embodiment of the package of FIG. 2 with a top package stacked thereover.

FIG. 3 illustrates an embodiment with a bottom folded stack package 30, and a top package 40 supported by the bottom folded stack package 30. The bottom package 30 is similar to the package 10. After folding the flap of the flexible substrate over the die encapsulant 25, the back side 16 of the flap 13B of the flexible substrate 12 becomes a substantially flat upper surface 27 of the package 10.

The substantially flat upper surface 27, as shown in FIG. 2, has bond pads 16A that are used to secure the bottom package 30 to the top package 40. Bumps of the top package 40 are aligned to the bonding pads 16A on the bottom package 30 and the packages are brought together, such that the top and bottom packages are stacked one on top of another. In one embodiment, the solder bumps on the top package are soldered to the bonding pads on the bottom package to form contacts 35. In one embodiment, the contacts 35 secure and electrically couple the top and bottom packages.

In one embodiment, reliability of the contacts 35 (or solder joints) between the top package 40 and the bottom package 30 is maximized. In one embodiment, shear stress exists on the contacts 35 (or solder joints) during temperature cycling of the package or device. This shear stress is partially a result of a difference in the coefficients of thermal expansion ("CTE") between the top and bottom packages. In this embodiment, this shear stress decreases the reliability of the contacts 35. In an embodiment, solder joint stress is substantially transferred to the compliant fold adhesive 26. In one embodiment, the fold adhesive 26 has compliant characteristics of a relatively high elongation (an elongation at break greater than about 100% at about room temperature), and a relatively low Young's modulus (less than about 600 MPa at about room temperature). Accordingly, because of the substantial transfer, the solder joints have a minimized strain level and are substantially prevented from deforming under stress.

With a substantially flat upper surface 27, a z-height of the bottom package is minimized in one embodiment. The bottom folded package warpage substantially determines the overall stacked package warpage and the z-height of the bottom package. In one embodiment, the bottom package warpage is substantially governed by the unfolded package warpage (including shrinkage of the die encapsulant) and the warpage that may be further induced by folding adhesive cure shrinkage. By using the low cure shrinkage, high elongation, folding adhesive 26, the overall bottom package warpage and z-height is minimized in one embodiment. In this embodiment, the folding adhesive 26 conforms to the surface 25A of the warped die encapsulant to form a substantially flat surface of the folding adhesive. In an additional embodiment, the adhesive 26 does not cause further warpage to the bottom package due to the minimal cure shrinkage, more particularly, a volumetric cure shrinkage of less than about 0.8%. With the minimized z-height of the bottom package, a successful bottom package to top package stacking process is likely.

The plurality of contacts 35 provides additional conductive paths for delivering signals and power between and/or to the top package 40 and the bottom package 30. The plurality of contacts 35 may also decrease the overall distance of many of the conductive paths within the package 10 depending on the design of the package 10. Although in the example embodiment illustrated, each of the contacts 35 are a solder column or a reflowed solder bump, it should be noted that any type of contact 35 may be used as long as contact 35 extends from the flexible substrate to the top package. For example, in an additional embodiment, the bottom and top packages are electrically and mechanically coupled using an adhesive, bumps (including solders or plastics), a conductive epoxy or some form of solder attachment, among other methods.

In this embodiment, the top package 40 includes a first die 42, a second die 44 supporting the first die 42, a spacer 46 between the first and second dice 42, 44, and wire bonds 48. The wire bonds 48 electrically couple the first and second dice 42, 44 with a substrate 50 upon which the dice 42, 44, are dispensed. The dice 42, 44, the spacer 46 and wire bonds 48 are encapsulated by a die encapsulant 52 similar to the die encapsulant described above. Other embodiments for the top package 40 are possible and depend upon the relevant circuit design considerations. In one embodiment, the spacer 46 is an epoxy or polyimide material, similar to a die attach layer, discussed in more detail below. In another embodiment, not shown, a die attach layer is dispensed between the second die 44 and the substrate 50.

Figure 4:
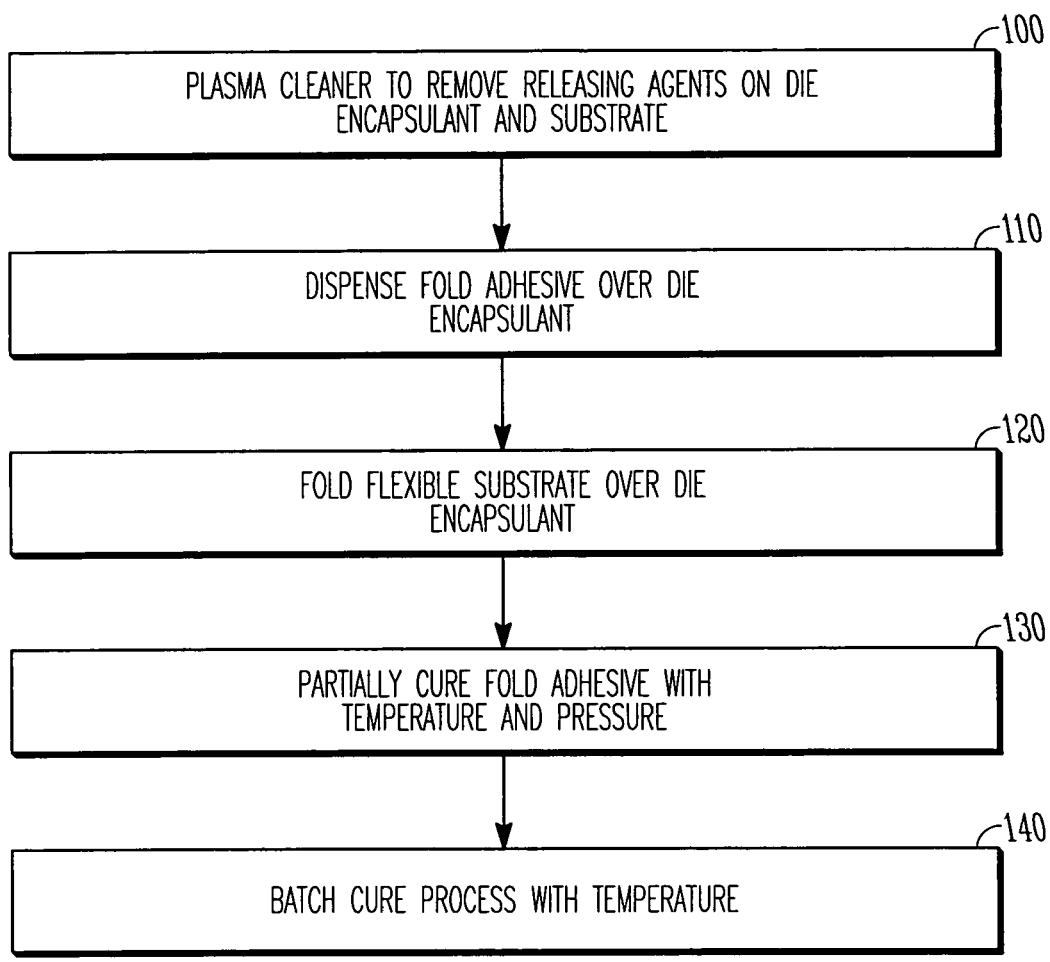
FIG. 4 is a flow chart illustrating steps of one embodiment to form a package.

In the embodiment of FIG. 4, the die encapsulant 25 encapsulates the die 24 at the first region 13A of the substrate 12. At 100, a plasma clean is performed to remove any releasing agents on the surface 25A of the die encapsulant 25 and on a front side 14 of the second region 13B of the substrate 12 before dispensing the fold adhesive. The releasing agents may have been left by the molding process.

In one embodiment, the plasma clean is performed by flowing oxygen into a reaction chamber having a plasma generating rf source powered at 50 to 250 watts. This low power is used to minimize chemical reactions. The flow of oxygen plasma contacts the releasing agents, removing releasing agents particles from the surface and charging the particles. The charged particles are then purged from the chamber by the gas flow and vacuum. Though the use of oxygen gas is described in the plasma clean step, one with skill in the art would realize that any heavy molecular gas could be used. Other gasses which could be used include argon and nitrogen. In an additional embodiment, the plasma clean is performed using a reactive ion etching. The reactive ion etching uses a reactive gas such as $CF_4$ or $SF_6$ or $O_2$, or mixtures thereof, and this reactive gas chemically attacks the surface to remove the releasing agents.

At 110, the fold adhesive 26 is dispensed over the die encapsulant 25. At 120, the flap 13B of the flexible substrate 12 is folded over the fold adhesive 26 and the die encapsulant 25. At 130, temperature and/or pressure is applied for a very short time period to partially cure the fold adhesive. In one embodiment, at step 130, the temperature is between about 150° C. and 200° C., and the pressure is applied for less than about 30 seconds. At 140, a batch cure process at about 150° C. using a Blue M® (General Signal Technology Corporation) oven completes the fold and adhere process in one embodiment. In this embodiment, the oven has temperature profile capability, such as the ability to control the temperature in the oven, the length of time at that temperature, as well as the rate of temperature increase/decrease.

Although the adhesive was described in FIGS. 1 to 3 in the context of a bottom package with a single encapsulated die, other embodiments are possible and depend upon the relevant circuit design considerations. Further, although the embodiment of FIG. 3 was described as having the bottom package 30 and the top package 40, the packages may be inverted such that the package 30 is "on top of" the package 40. In an additional embodiment, there may be two packages 30, one on top of another, or two packages 40, one on top of another.

Figure 5:
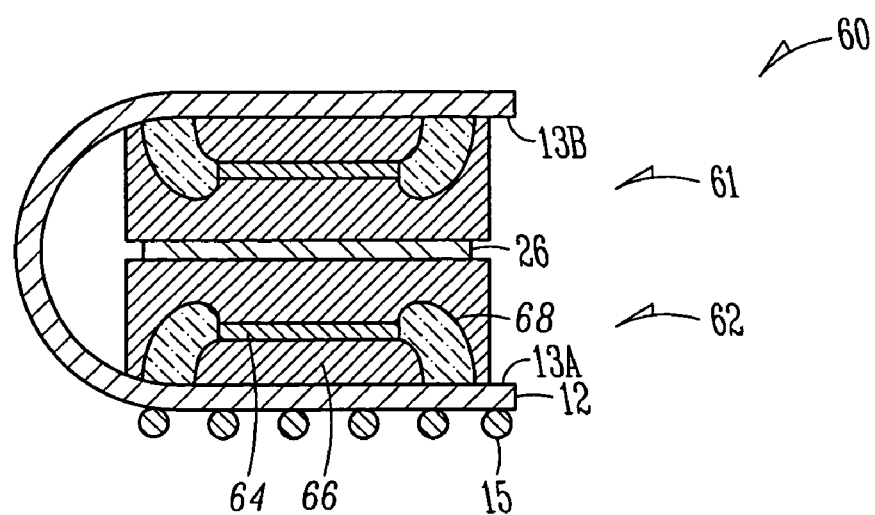
FIG. 5 is a side view illustrating one embodiment of a package with dual die encapsulants.
Figure 6:
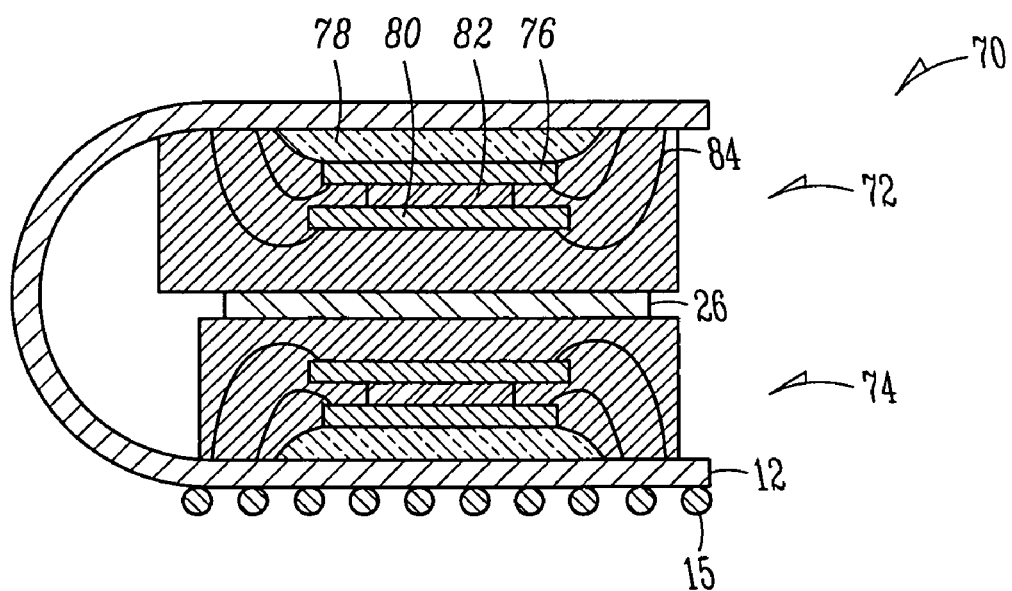
FIG. 6 is a side view illustrating another embodiment of a package with dual die encapsulants.

Also, consider for example, FIGS. 5 and 6. In the embodiments of FIGS. 5 and 6, packages 60 and 70 are illustrated. In embodiments, the packages 60 and 70 may be bottom and/or top packages.

In the embodiment of FIG. 5, the package 60 includes the flexible substrate 12 supporting a first single die encapsulant 61 at the second region 13B and a second single die encapsulant 62 at the first region 13A. The first and second single die encapsulants 61 and 62 are similar in this embodiment. Top surfaces of the first and second single die encapsulants 61 and 62 are joined upon folding the substrate 12, similar to previous embodiments. The adhesive 26 is dispensed between the die encapsulants 61 and 62, onto either encapsulant. The die encapsulant 62 encapsulates a die 64 supported on a die attach layer 66, and wire bonds 68 electrically coupling the die with the substrate 12. The die encapsulant 61 has similar elements and characteristics to the die encapsulant 62, in this embodiment. In one embodiment, the die attach layer 66 is made of a material that includes at least one of an epoxy or a polyimide. The die attach layer 66 may have a thickness ⅓ to ½ that of the die.

In one embodiment of FIG. 6, the package 70 includes the flexible substrate 12 supporting a first multiple die encapsulant 72 and a second multiple die encapsulant 74. The first and second single multiple encapsulants 72 and 74 are similar in this embodiment. Top surfaces of the first and second multiple die encapsulants 72 and 74 are joined upon folding the substrate 12, similar to previous embodiments. The adhesive 26 is dispensed between the die encapsulants 72 and 74, onto either encapsulant. The die encapsulant 72 encapsulates a first die 76 supported on a die attach layer 78, a second die 80 supported by a spacer 82 between the first die 76 and the second die 80, and wire bonds 84 electrically coupling the dice 76, 80 with the substrate 12. The die encapsulant 72 has similar elements and characteristics to the die encapsulant 74, in this embodiment.

FIGS. 1 to 6 are merely representational and are not drawn to scale. Certain proportions thereof may be exaggerated, while others may be minimized. Many other embodiments will be apparent to those of skill in the art upon reviewing the above description. Parts of some embodiments may be included in, or substituted for, those of other embodiments.

Although the inventive concept may be discussed in the exemplary context of a folded stack bottom package, the claims are not so limited. Indeed, embodiments of the present invention may well be implemented as part of any package system, including an electronic system such as a wireless system or a computer system. The elements, materials, geometries, dimensions, and sequence of operations can all be varied to suit particular packaging requirements.

Figure 7:
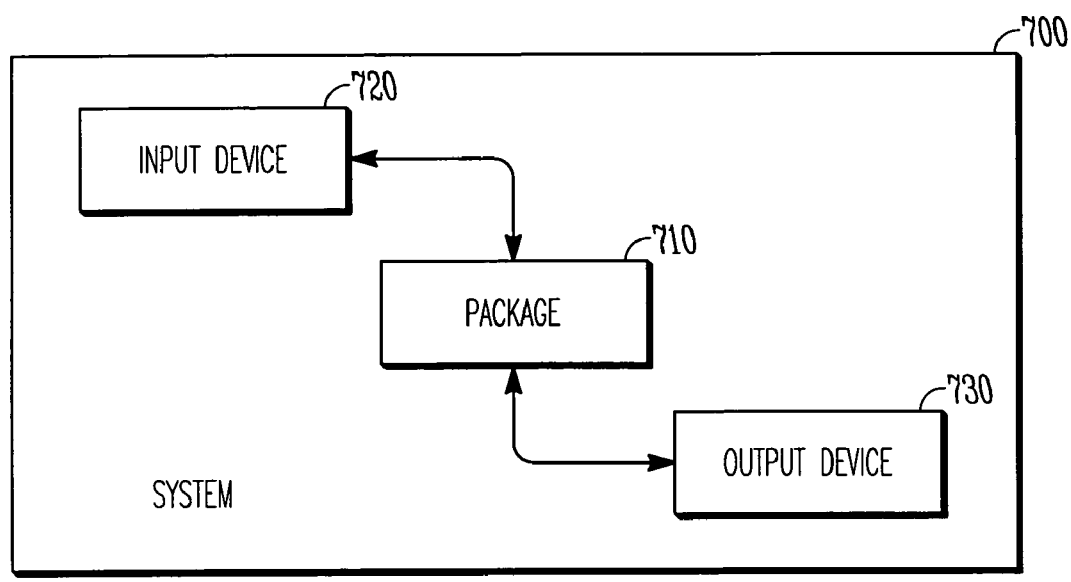
FIG. 7 is a depiction of a system according to an embodiment.

FIG. 7 is a depiction of a system 700 according to an embodiment. In one embodiment, the system 700 is a wireless system. In other embodiments, the system 700 is a computer system. In still other embodiments, the system 700 is any type of electronic system. Some examples of system 700 include but are not limited to cellular telephones and other wireless devices or communicators, computers, personal digital assistants (PDAs) or other hand-held devices, workstations, radios, video players, vehicles (e.g. an automobile, a locomotive, an aircraft, a watercraft, and a spacecraft), and the like.

The system 700 comprises at least one package 710, an input device 720 and an output device 730. In one embodiment, the package 710 includes a fold adhesive described in at least one of the embodiments herein. The package 710 may include any semiconducting device, for example, a microprocessor, a microcontroller, memory, a graphics processor or a digital signal processor, and/or a custom circuit or an application-specific integrated circuit, such as a communications circuit for use in wireless devices such as cellular telephones, pagers, portable computers, two-way radios, and similar electronic systems. In one embodiment, an input device 720 and an output device 730 are each communicatively coupled to the package 710. The input device 720 is any type of device to receive data from a user or another system. Some examples of input devices include a mouse, a trackball, a touchpad, a keyboard or a voice-controlled device or a microphone. The output device is any type of device to output data to a user or another system. Some example output devices include a display device or a speaker.

In some embodiments, the system may further include a voltage source that is electrically coupled to the semiconducting device. Voltage source may be used to supply power to a die (e.g., a processor) that is within semiconducting device.

The system may also include an external memory that in turn includes one or more memory elements suitable to the particular application, such as a main memory in the form of random access memory (RAM), one or more hard drives, and/or one or more drives that handle removable media, such as floppy diskettes, compact disks (CDs) and digital video disks (DVDs).

The Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A method of forming a package comprising:
   supporting a die on a flexible substrate;
   encapsulating the die with a die encapsulant;
   folding a flap of the flexible substrate over the die encapsulant;
   introducing fold adhesive between the folded flap of the flexible substrate and a surface of the die encapsulant;
   conforming the fold adhesive to the surface such that the fold adhesive is substantially flat; and
   curing the fold adhesive, wherein the fold adhesive has a volumetric cure shrinkage of less than about 0.8%.

2. The method of claim 1 wherein curing includes a partial cure of the fold adhesive using a cure process with at least one of temperature and pressure, and then a substantially full cure using a temperature batch cure process.

3. The method of claim 1 further comprising plasma cleaning to remove releasing agents on the surface of the die encapsulant and on a front side of the substrate before dispensing the fold adhesive.

4. The method of claim 1 wherein the fold adhesive is dispensed onto the die encapsulant before the flexible substrate is folded over the die encapsulant.

5. The method of claim 1 wherein the volumetric cure shrinkage of the adhesive facilitates a back side of the flexible substrate at the folded flap to become a substantially flat upper surface of the package.

6. The method of claim 5 further comprising minimizing a z-height of the flexible substrate.

7. The method of claim 1 further comprising supporting a top package upon the folded flap of the flexible substrate.

8. A method of forming a package comprising:
   supporting a die on a flexible substrate;
   encapsulating the die with a die encapsulant;
   folding a flap of the flexible substrate over the die encapsulant;
   introducing fold adhesive between the folded flap of the flexible substrate and a surface of the die encapsulant;
   conforming the fold adhesive to the surface such that the fold adhesive is substantially flat;
   supporting a top package upon the folded flap of the flexible substrate; and
   providing solder joints between the top package and a substantially flat upper surface of the folded flap of the flexible substrate; and
   maximizing reliability of the solder joints by transferring a substantial amount of stress from the solder joints to the fold adhesive, wherein the fold adhesive is substantially compliant due to a Young's modulus of less than about 600 MPa at about room temperature, and an elongation at break greater than about 100% at about room temperature.

9. The method of claim 1 wherein the fold adhesive is selected from the group consisting of at least one of silicone, a silicone modified epoxy, a polyimide-siloxane based system, vinyl terminated silane, hydrogen terminated silane, platinum catalyst, fumed silica, polyimide siloxane, aliphatic epoxy, phenol hardener, imidazole catalyst, an epoxy, an amine end capped silicone, phosphine catalyst, a silica filler and other filler particles.

10. The method of claim 1 wherein the fold adhesive is selected from the group consisting of at least one of silicone, a silicone modified epoxy, and a polyimide-siloxane based system.

11. A method of forming a package comprising:
    supporting a die on a flexible substrate;
    encapsulating the die with a die encapsulant;
    folding a flap of the flexible substrate over the die encapsulant;
    introducing fold adhesive between the folded flap of the flexible substrate and a surface of the die encapsulant; and
    conforming the fold adhesive to the surface such that the fold adhesive is substantially flat,
    wherein the fold adhesive is selected from the group consisting of at least one of vinyl terminated silane, hydrogen terminated silane, platinum catalyst, fumed silica and other filler particles.

12. The method of claim 1 wherein the fold adhesive is selected from the group consisting of at least one of polyimide siloxane, aliphatic epoxy, phenol hardener, and imidazole catalyst.

13. The method of claim 1 wherein the fold adhesive is selected from the group consisting of at least one of an epoxy, an amine end capped silicone, phosphine catalyst, and a silica filler.

14. The method of claim 8 wherein the volumetric cure shrinkage of the adhesive facilitates a back side of the flexible substrate at the folded flap to become a substantially flat upper surface of the package.

15. The method of claim 8 further comprising minimizing a z-height of the flexible substrate.

16. The method of claim 11 further comprising curing the fold adhesive, wherein the fold adhesive has a volumetric cure shrinkage of less than about 0.8%.

17. The method of claim 11 further comprising partial curing of the fold adhesive using a cure process with at least one of temperature and pressure, and then a substantially full cure using a temperature batch cure process.

* * * * *